US006852999B2

(12) United States Patent
Farnworth et al.

(10) Patent No.: US 6,852,999 B2
(45) Date of Patent: *Feb. 8, 2005

(54) REDUCED TERMINAL TESTING SYSTEM

(75) Inventors: Warren M. Farnworth, Nampa, ID (US); Leland R. Nevill, Boise, ID (US); Raymond J. Beffa, Boise, ID (US); Eugene H. Cloud, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 48 days.

This patent is subject to a terminal disclaimer.

(21) Appl. No.: 10/391,067

(22) Filed: Mar. 17, 2003

(65) Prior Publication Data

US 2003/0178692 A1 Sep. 25, 2003

Related U.S. Application Data

(60) Continuation of application No. 09/638,276, filed on Aug. 14, 2000, now Pat. No. 6,534,785, which is a continuation of application No. 08/994,843, filed on Dec. 19, 1997, now Pat. No. 6,118,138, which is a division of application No. 08/713,606, filed on Sep. 13, 1996, now Pat. No. 5,898,186.

(51) Int. Cl.$^7$ .................. H01L 23/58; H01L 27/10; H01L 21/8238; G01R 31/26
(52) U.S. Cl. .................. 257/48; 257/203; 257/207; 257/208; 438/199; 438/200; 324/765
(58) Field of Search .................. 257/48, 203, 207–209, 257/529, 530; 438/199, 200; 324/765

(56) References Cited

U.S. PATENT DOCUMENTS

| | | |
|---|---|---|
| 3,963,985 A | 6/1976 | Geldermans |
| 4,038,599 A | 7/1977 | Bove et al. |
| 4,434,401 A | 2/1984 | York |
| 4,899,107 A | 2/1990 | Corbett et al. |
| 4,968,931 A | 11/1990 | Littlebury et al. |

(List continued on next page.)

FOREIGN PATENT DOCUMENTS

| | | |
|---|---|---|
| JP | 363268428 | 11/1988 |
| JP | 410070160 | 3/1998 |

*Primary Examiner*—Donghee Kang
(74) *Attorney, Agent, or Firm*—TraskBritt

(57) ABSTRACT

A semiconductor wafer having dice that include circuitry that is placed into a mode when the circuitry receives an alternating signal having certain characteristics. The alternating signal may be supplied from a system controller through a probe, probe pad, and conductive path on the wafer. In a preferred embodiment, the conductive path simultaneously carries a VCC power signal and the alternating signal to the circuitry. However, the alternating signal may be carried on a conductive path different from the one carrying the VCC signal. A great deal of information may be conveyed through the alternating signal, making other signals unnecessary in controlling, testing, stressing, and repairing dice on the wafer. For example, clocking information may be conveyed through the alternating signal. The circuitry may be placed in different modes in response to different characteristics of the alternating signal. The alternating signal and a VCC power signal are received through a single contact on each die. A wafer mode controlling system includes a system controller to control application of the alternating signals and other signals to the dice on the wafer. The semiconductor wafer mode controlling system may also control a probe positioning controller including an array of probes that selectively brings the probes into contact with the probe pads, whereby the alternating signal having the certain characteristics is transmitted from the probe to the circuitry through the probe pad and conductive path and the circuitry of each of the dice is placed into the mode.

3 Claims, 13 Drawing Sheets

U.S. PATENT DOCUMENTS

| | | |
|---|---|---|
| 5,010,296 A | 4/1991 | Okada et al. |
| 5,034,685 A | 7/1991 | Leedy |
| 5,034,688 A | 7/1991 | Moulene et al. |
| 5,070,297 A | 12/1991 | Kwon et al. |
| 5,123,850 A | 6/1992 | Elder et al. |
| 5,198,752 A | 3/1993 | Miyata et al. |
| 5,198,753 A | 3/1993 | Hamburgen |
| 5,210,485 A | 5/1993 | Kreiger et al. |
| 5,266,894 A | 11/1993 | Takagi et al. |
| 5,286,656 A | 2/1994 | Keown et al. |
| 5,302,891 A | 4/1994 | Wood et al. |
| 5,325,052 A | 6/1994 | Yamashita |
| 5,327,074 A | 7/1994 | Ehiro |
| 5,339,273 A | 8/1994 | Taguchi |
| 5,342,807 A | 8/1994 | Kinsman et al. |
| 5,389,556 A | 2/1995 | Rostoker et al. |
| 5,410,261 A | 4/1995 | Hashinaga |
| 5,436,559 A | 7/1995 | Takagi et al. |
| 5,442,282 A | 8/1995 | Rostoker et al. |
| 5,446,695 A | 8/1995 | Douse et al. |
| 5,457,400 A | 10/1995 | Ahmad et al. |
| 5,457,401 A | 10/1995 | Hashinaga |
| 5,483,175 A | 1/1996 | Ahmad et al. |
| 5,504,369 A | 4/1996 | Dasse et al. |
| 5,548,884 A | 8/1996 | Kim |
| 5,859,442 A | 1/1999 | Manning |
| 5,898,186 A | 4/1999 | Farnworth et al. |
| 5,976,899 A | 11/1999 | Farnworth et al. |
| 5,994,915 A | 11/1999 | Farnworth et al. |
| 6,118,138 A | 9/2000 | Farnworth et al. |
| 6,292,009 B1 | 9/2001 | Farnworth et al. |
| 6,424,168 B1 | 7/2002 | Farnworth et al. |
| 6,534,785 B1 * | 3/2003 | Farnworth et al. ............ 257/48 |

* cited by examiner

REDUCED TERMINAL TESTING SYSTEM

CROSS-REFERENCE TO RELATED APPLICATIONS

This application is a continuation of application Ser. No. 09/638,276, filed Aug. 14, 2000, now U.S. Pat. No. 6,534,785, issued Mar. 18, 2003, which is a continuation of application Ser. No. 08/994,843, filed Dec. 19, 1997, now U.S. Pat. No. 6,118,138, issued Sep. 12, 2000, which is a divisional of application Ser. No. 08/713,606, filed Sep. 13, 1996, now U.S. Pat. No. 5,898,186, issued Apr. 27, 1999.

BACKGROUND OF THE INVENTION

1. Field of the Invention

The invention relates to a semiconductor wafer mode controlling assembly and, more particularly, to such an assembly in which modes of circuitry of dice (ICs) on the wafer are controlled through alternating signals applied to the dice through probe pads on the wafers. The invention also includes methods for constructing and operating such wafers the assembly.

2. State of the Art

Typically, finished integrated circuit chip assemblies include a die or dice attached to a lead frame and encapsulated with an encapsulant. Numerous expensive and time consuming steps are involved in producing such chip assemblies. These steps may include the following: (1) forming dice on a wafer substrate, (2) testing the dice, (3) cutting dice from the wafer, (4) connecting a die or dice to a lead frame, (5) encapsulating the die or dice, lead frame, connecting wires, and any auxiliary circuitry, (6) performing burn-in and providing other stresses to the dice, and (7) testing the assembly.

Defects in a finished chip assembly can prevent it from operating as intended. In spite of painstaking attention to detail, defects may be introduced at various levels of production. For example, manufacturing defects in the die may cause a failure. It has been found, however, that some defects are manifest immediately, while other defects are manifest only after the die has been operated for some period of time.

Reliability curves are used to express a hazard rate or instantaneous failure rate h(t) over time t, and often have a "bath tub" shape. The reliability curves for many, if not all, ICs are generally like that shown in FIG. 1. The reliability curve in FIG. 1 may be divided into three regions: (1) an infant mortality region, (2) a random failures region, and (3) a wearout region.

The infant mortality region begins at time $t_0$, which occurs upon completion of the manufacturing process and initial electrical test. Some ICs, of course, fail the initial electrical test. Inherent manufacturing defects are generally expected in a small percentage of ICs, even though the ICs are functional at time $t_0$. Because of these inherent manufacturing defects (that may be caused by contamination and/or process variability), these ICs have shorter lifetimes than the remaining population. Typically known as ICs suffering "infant mortalities," while the ICs may constitute a small fraction of the total population, they are the largest contributor to early-life failure rates.

Once ICs subject to infant mortality failure rates have been removed from the IC population, the remaining ICs have a very low and stable field failure rate. The relatively flat, bottom portion of the bathtub curve, referred to as the random failure region, represents stable field-failure rates which occur after the IC failures due to infant mortalities have been removed and before IC wearout occurs.

Eventually, as wearout occurs, the failure rate of the ICs begins to increase rapidly. However, the average lifetime of an IC is not clearly understood, because most lab tests simulate only a few years of normal IC operation.

"Burn-in" refers to the process of accelerating failures that occur during the infant morality phase of component life in order to remove the inherently weaker ICs. The process has been regarded as critical for product reliability since the semiconductor industry began. There have been two basic types of burn-in. During the process known as "static" burn-in, temperatures are increased (or sometimes decreased) while only some of the pins on a test IC are biased. No data is written to the IC, nor is the IC exercised under stress during static burn-in. During "unmonitored dynamic" burn-in, temperatures are increased while the pins on the test IC are biased. The IC is cycled under stress, and data patterns are written to the IC but not read. Hence, there is no way of knowing whether the data written is retained by the cell.

In recent years, as memory systems have grown in complexity, the need for more and more reliable components has escalated. This need has been met in two ways. First, manufacturing process technology has reached a level of maturity and stability where inherent manufacturing defects, caused by contamination and process variation, have been reduced. As a result, latent failures have been significantly reduced, resulting in lower field failure rates. Secondly, more sophisticated methods of screening infant mortalities have been developed. As IC manufacturing practices have become more consistent, it has become clear that burn-in systems that simply provide stress stimuli in the form of high temperature and VCC (power) to the IC under test may be inadequate in two areas: (1) such burn-in systems cannot detect and screen infant mortality failure rates measured in small fractions of a percent, (2) such burn-in systems are unable to confirm random failure rates that are claimed to be significantly lower than 100 FITs (i.e., fewer than 100 failures per billion IC hours) at normal system operating conditions.

To address these issues, an "intelligent burn-in" approach can be utilized. The term "intelligent burn-in," as used in this discussion, refers to the ability to combine functional, programmable testing with the traditional burn-in cycling of the IC under test in the same chamber. Advantages to this approach include:

(1) The ability to identify when a failure occurs and, thereby, compute infant morality rates as a function of burn-in time. As a result, an optimal burn-in time for each product family can be established.

(2) The ability to correlate burn-in failure rates with life test data typically obtained by IC manufacturers to determine the field failure rates of their products.

(3) The ability to incorporate into the burn-in process certain tests traditionally performed using automatic test equipment (ATE) systems, thereby reducing costs.

Some ICs have internal test modes not accessible during normal operation. These test modes may be invoked on ATE by applying a high voltage to a single pin. The IC is then addressed in a manner so as to specify the operating mode of interest. Operating modes such as data compression, grounded substrate, and cell plate biasing can be enabled, thus allowing evaluation of IC sensitivities and help in isolating possible failure mechanisms.

The electrical characterization data gathered from these tests is used to identify which part of the circuit appears to be malfunctioning, the possible location(s) on the IC, and the probable type or nature of the defect. To facilitate discussion and reporting, failures are often classified according to their electrical characteristics, referred to as the failure mode. Typical classification of these modes includes the following: single cell defect, adjacent cell defect, row failure, column failure, address failure, open pin, supply leakage, pin leakage, standby current leakage, and entire array failure (all dead cells).

In anticipation that some ICs will have defects, many ICs are designed with redundancies. In such ICs, a defective section of the IC may be shut off and a redundant but properly operating section activated and used in place of the defective section. For example, typical integrated memory circuits include arrays of memory cells arranged in rows and columns. In many such integrated memory arrays, several redundant rows and columns are provided to be used as substitutes for defective rows or columns of memory. When a defective row or column is identified, rather than treating the entire array as defective, a redundant row or column is substituted for the defective row or column. This substitution is performed by assigning the address of the defective row or column to the redundant row or column such that, when an address signal corresponding to the defective row or column is received, the redundant row or column is addressed instead.

To make substitution of the redundant row or column substantially transparent to a system employing the memory circuit, the memory circuit may include an address detection circuit. The address detection circuit monitors the row and column addresses and, when the address of a defective row or column is received, enables the redundant row or column instead.

One type of address detection circuit is a fuse-bank address detection circuit. Fuse-bank address detection circuits employ a bank of sense lines where each sense line corresponds to a bit of an address. The sense lines are programmed by blowing fuses in the sense lines in a pattern corresponding to the address of the defective row or column. Addresses are then detected by first applying a test voltage across the bank of sense lines. Then, bits of the address are applied to the sense lines. If the pattern of blown fuses corresponds exactly to the pattern of address bits, the sense lines all block current and the voltage across the bank remains high. Otherwise, at least one sense line conducts and the voltage falls. A high voltage thus indicates the programmed address has been detected. A low voltage indicates a different address has been applied.

Antifuses have been used in place of conventional fuses. Antifuses are capacitive-type structures that, in their unblown states, form open circuits. Antifuses may be "blown" by applying a high voltage across the antifuse. The high voltage causes the capacitive-type structure to break down, forming a conductive path through the antifuse. Various flash devices may be used.

Typically, ICs have numerous contacts that provide interfaces between the circuits within the die and the outside world. The contacts are used for bond pads to which bond wires are connected. The bond wires are also connected to the lead frame. The contacts (bond pads) may be used for various signals including those for addressing, data (DQ), VCC (power), VSS (ground), and control. However, physically, the contacts are extremely small or tiny. As such, it is impractical and expensive to provide direct connections between each of the contacts and probes used in, for example, testing, stressing, or repairing the IC. Probe pads that are much larger than die contacts have been placed on, for example, the edge of the wafer. However, the sheer volume of contacts limits the number of contacts to which probe pads may be practically connected.

If there is a defect in an IC, it is desirable to discover the defect as early as possible in the manufacturing process for a finished chip assembly. In that case, if it is determined that the defect cannot be repaired, the time and expense of completing a chip assembly will not be expended. Further, some repairs may be less expensive to repair at an earlier stage of production of the chip assembly.

Accordingly, it would be desirable to test, stress, and, if necessary, attempt to repair ICs while they are still on a wafer, rather than in a packaged chip assembly.

U.S. Pat. No. 5,504,369 to Dasse et al. describes an apparatus for performing wafer level testing of integrated circuit dice. Burn-in is described as being performed while the dice are still connected to the wafer. Conductors are connected between wafer contact pads and contacts (bonding pads) on dice. In a preferred embodiment, the conductors supply six voltage signals: power supply high voltage level signal, data signal, reset signal, clock signal, power supply memory programming voltage level signal, and ground voltage level signal. For the following reasons, connecting six conductors to each die has a considerable effect in terms of wafer real estate and/or processing steps. There are a large number of dice on the wafer. Current requirements dictate using numerous wafer contact pads and conductors to supply signals to the dice. Included extra conductors for redundancies increase the number by at least a factor of two. Further, the conductors are positioned on top of the dice and/or in the dicing lanes (streets or street area of the wafer). Placing all six conductors in the dicing lanes requires either stacking the conductors one on top of the other in a dicing lane, and/or widening the dicing lane (which may reduce the number of dice of the wafer). Placing several conductors over the dice requires additional processing steps. The processing steps may be further increased where conductors run both vertically and horizontally.

Accordingly, there is a need for an assembly in which a variety of signals may be supplied to dice in wafer form through a small number of contacts and conductive paths.

BRIEF SUMMARY OF THE INVENTION

The present invention relates to a semiconductor wafer having dice that include circuitry that is placed into a mode when the circuitry receives an alternating signal having certain characteristics. The alternating signal may be supplied from a system controller through a probe, probe pad, and conductive path on the wafer. In a preferred embodiment, the conductive path simultaneously carries a VCC power signal and the alternating signal to the circuitry. However, the alternating signal may be carried on a conductive path different from the one carrying the VCC signal.

A great deal of information may be conveyed through the alternating signal, making other signals unnecessary in controlling, testing, stressing, and repairing dice on the wafer. For example, clocking information may be conveyed through the alternating signal. The circuitry may be placed in different modes in response to different characteristics of the alternating signal.

The alternating signal and a VCC power signal are received through a single contact on each die. There may be redundant contacts, conductive paths, and probe pads.

The dice may include additional circuitry that produces a signal indicating a particular event (e.g., a test is completed) has occurred. A fuse may be blown at the occurrence of the event.

A semiconductor wafer mode controlling system includes a system controller to control application of the alternating signals and other signals to the dice on the wafer. The semiconductor wafer mode controlling system may also control a probe positioning controller including an array of probes that selectively brings the probes into contact with the probe pads, whereby the alternating signal having the certain characteristics is transmitted from the probe to the circuitry through the probe pad and conductive path and the circuitry of each of the dice is placed into the mode. Each die on the wafer may be identical or there may be differences in the dice. Where there are differences, the system controller may supply alternating signals having different characteristics as needed.

The circuitry in the dice includes a local oscillator. A local oscillator may be off the die and the wafer or in the system controller.

When the dice are cut from the wafers and packaged or otherwise used in commercial applications, the circuitry may continue to be enabled or may be disabled before a chip assembly containing one or more such dice is completed.

A wafer according to the present invention may be used in connection with a wide variety of semiconductor devices including memories (e.g., DRAM or SRAM), microprocessors, control circuits, and ASICs. The wafer may be used in computer systems and in a wide variety of other electronic devices.

The invention includes a method of constructing wafers and wafer mode controlling systems that have the above described characteristics.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

A. Wafer Overview

Figure 1:
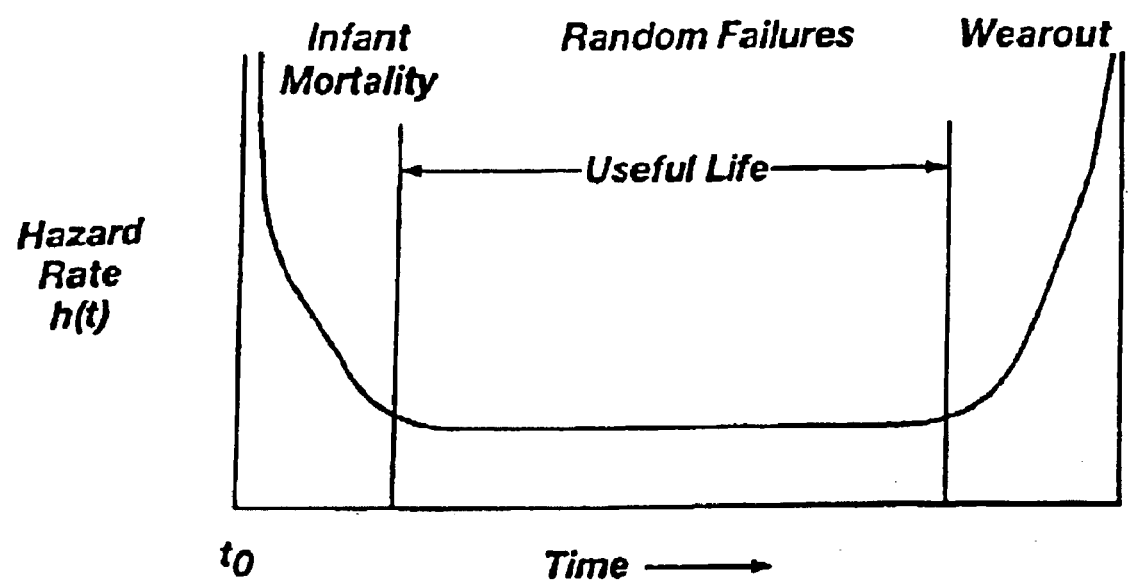
FIG. 1 shows a graphical representation of a reliability curve that expresses a hazard rate h(t) as function of time t.
Figure 2A:
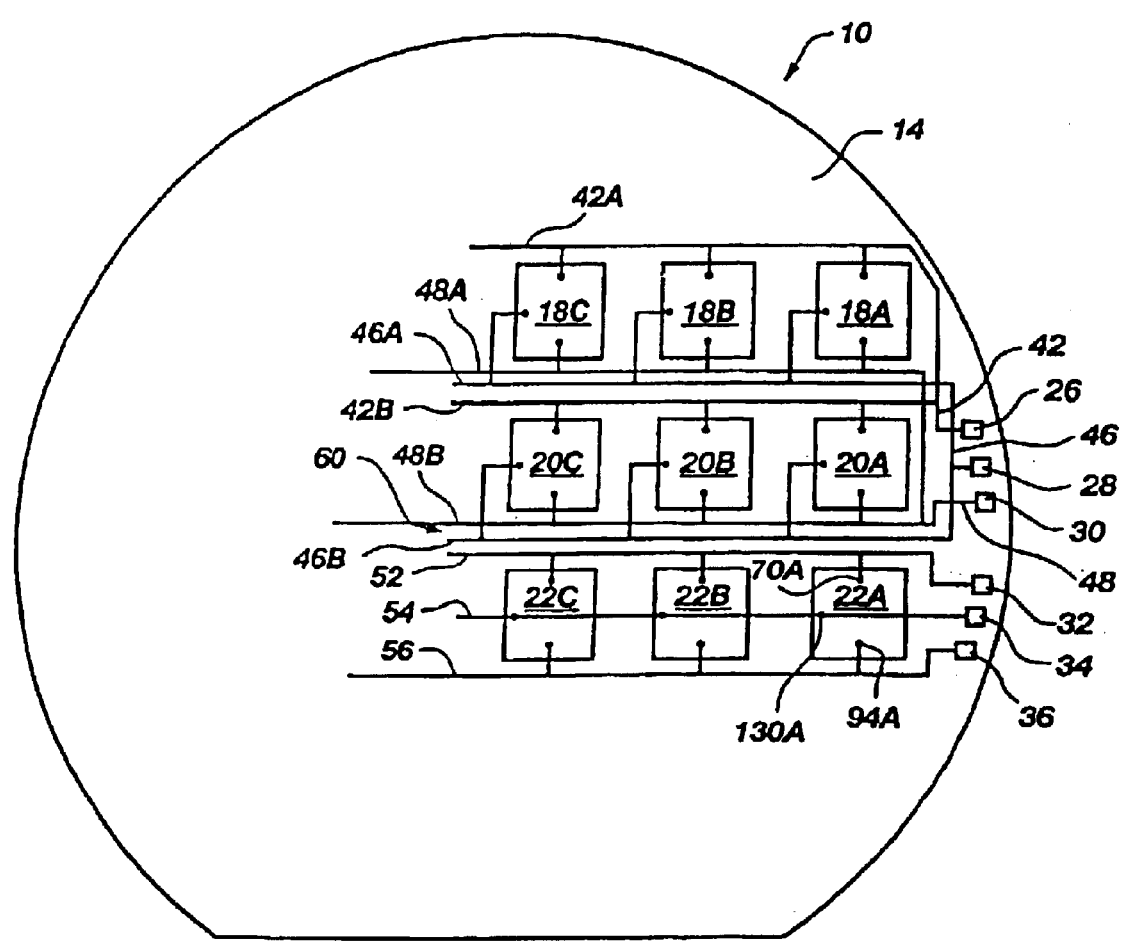
FIG. 2A shows a schematic top view of a semiconductor wafer under one embodiment of the present invention.

Referring to FIG. 2A, a semiconductor wafer 10 includes a substrate 14 onto which numerous dice are formed through etching, deposition, or other well known techniques. Since there are many dice on a wafer, for clarity of illustration, only dice 18A, 18B, 18C, 20A, 20B, 20C, 22A, 22B, and 22C (collectively "dice 18–22") are shown.

Probe pads 26, 28, 30, 32, 34, and 36 (collectively "probe pads 26–36") are formed on substrate 14. Because the size of dice 18–22 is exaggerated with respect to the size of wafer 10 and probe pads 26–36, the optimal placement of probe pads 26–36 is not shown. However, probe pads 26–36 should be positioned such that the total number or dice on wafer 10 is either not reduced at all or reduced only by a minimum due to the presence of probe pads 26–36. Such placement may be along the edge of wafer 10 where there is unused space caused by the round shape of wafer 10 and the non-round shape of the dice.

Conductive paths, which may be conductive traces, are connected between probe pads 26–36 and contacts on dice 18–22. For example, a conductive path 42, which includes branches 42A and 42B, is positioned between probe pad 26 and a first contact on dice 18A–18C and 20A–20C. A conductive path 46, which includes branches 46A and 46B, is positioned between probe pad 28 and a second contact on dice 18A–18C and 20A–20C. A conductive path 48, which includes conductive path branches 48A and 48B, is positioned between probe pad 30 and a third contact on dice 18A–18C and 20A–20C.

Further, a conductive path 52 is connected between probe pad 32 and particular contacts on a first contact of dice 22A–22C. A conductive path 54 is connected between probe pad 34 and a second contact of dice 22A–22C. A conductive path 56 is connected between probe pad 36 and a third contact on dice 22A–22C.

The conductive paths may run between dice in dicing lanes or "streets," or run over dice. (A conductive path may also run in a street and over a dice.) For example, conductive paths 46B, 48B, and 52 run along a street 60 between dice 20A–20C and dice 22A–22C. As an example of different possibilities, conductive path 54 runs over dice 22A–22C. An insulating coating, such as a borophosphosilicate glass (BPSG) coating, may separate a die from a conductive path. Further, to keep the streets narrow, conductive paths may be stacked on top of each other. A via or other connection may be made from a conductive path through the coating to a contact on die 22A. Coatings may also be useful to the extent conductive paths overlap. An advantage of the present invention over the prior art is that the number of conductive paths is reduced, thereby reducing processing steps in insulating conductive paths from each other and other components on the wafer and, if necessary, in removing insulation.

As illustrated, probe pads 26, 28, and 30 are connected to two sets of dice (i.e., 18A–18C and 20A–20C). Probe pads 32, 34, and 36, however, are connected to only one set of dice (i.e., 22A–22C). This difference illustrates that the invention is not limited to a particular number of dice being connected to a probe. In practice, the controlling software may be simpler if each probe pad is connected to the same number of dice, but that is not required. Further, the controlling software will be simpler if each die on a wafer is identical. However, the invention is not limited to the dice on a wafer being identical.

In FIG. 2A, conductive paths are shown running in only horizontal directions. However, the conductive paths may run in both horizontal and vertical directions, although doing so may add additional processing steps. The conductive paths may run in only the vertical direction.

Figure 2B:
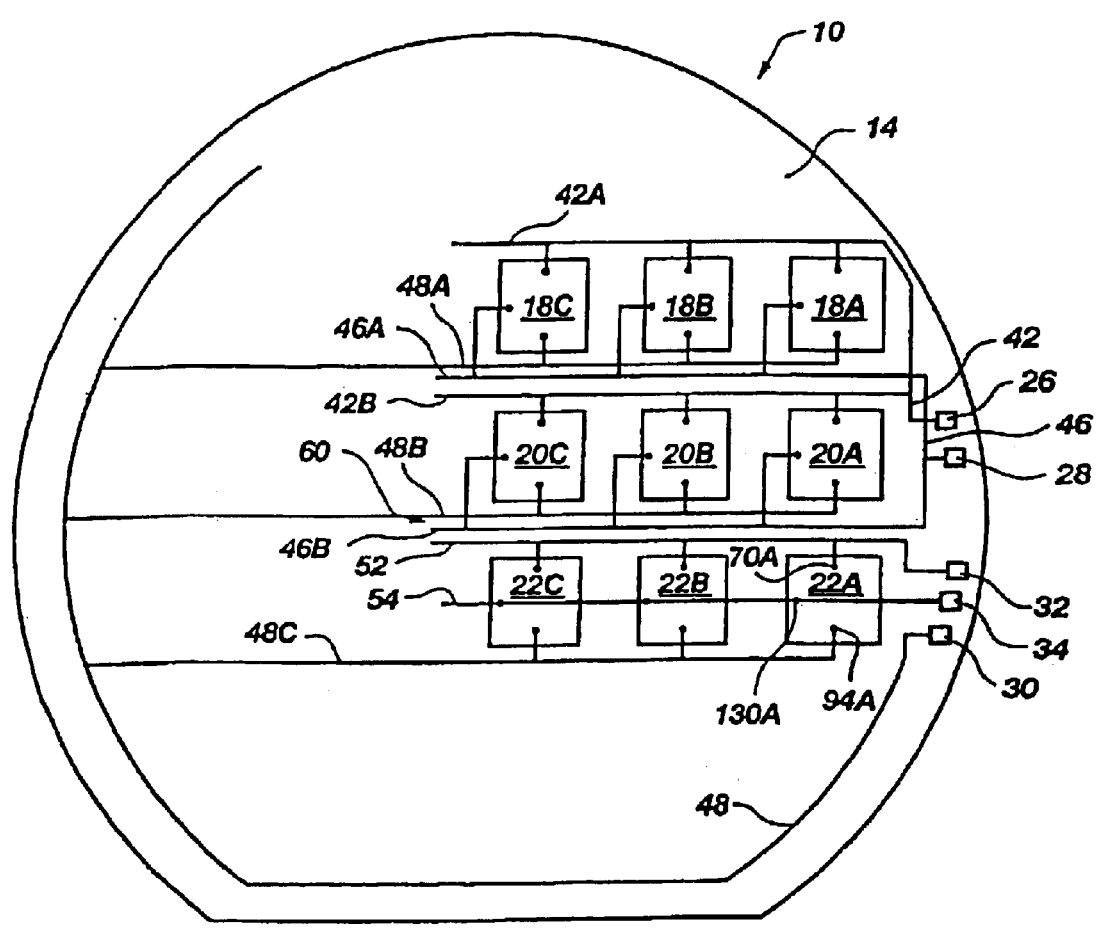
FIG. 2B shows a schematic top view of a semiconductor wafer under another embodiment of the present invention.

FIG. 2B is an alternative embodiment, which is the same as FIG. 2A except that all the dice on the wafer are connected to a single probe pad 30 through conductive path 48, which in turn is connected to conductive path branches 48A, 48B, and 48C, etc. Probe pad 30 may be connected to VSS. As still another alternative embodiment, substrate 14 may be connected to VSS, eliminating another probe pad.

B. Die Circuitry and Alternating Signal Examples

Figure 3:
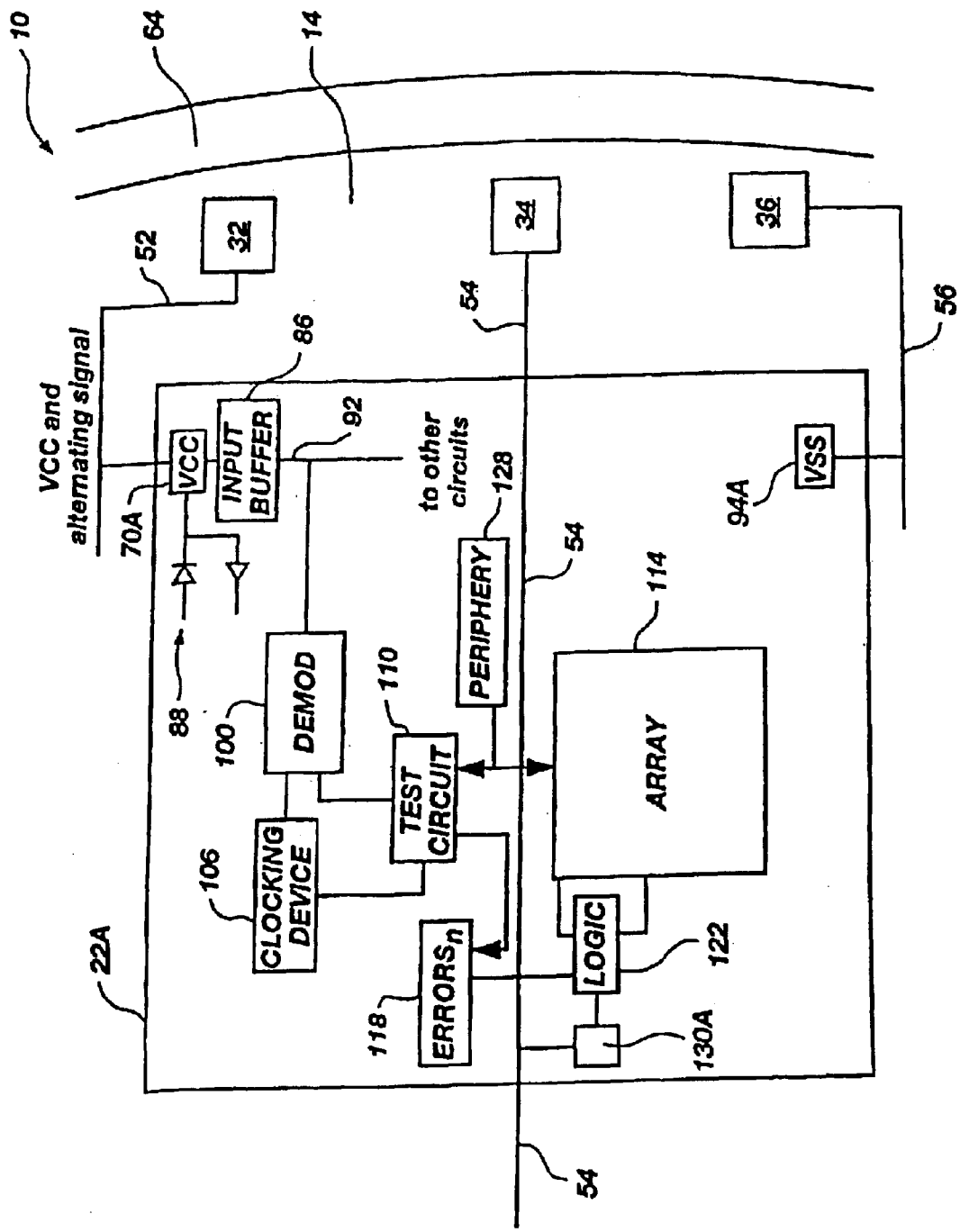
FIG. 3 shows a more detailed representation of an example of circuitry in a die on a wafer of FIG. 2A.

FIG. 3 provides an example of circuitry in die 22A of wafer 10 of FIG. 2A. FIG. 3 is schematic in that the components are not necessarily to scale or in the only relative position. Various other circuitry may also be employed in addition to or in place of the circuitry illustrated in FIG. 3.

Referring to FIG. 3, conductive path 52 connects probe pad 32 (near an edge 64 of wafer 10) to a contact or bond pad 70A on die 22A. In ordinary operation of die 22A, conductive path 52 and contact 70A carry a VCC signal to internal circuitry of die 22A. To control modes of the circuitry of die 22A, an alternating signal may be applied simultaneously with the VCC signal to conductive path 52 and contact 70A. The alternating signal may be a continuous or discontinuous digital signal, a continuous or discontinuous analog signal, or some combination of them. The alternating signal may employ a modulation scheme, such as frequency modulation (FM), amplitude modulation (AM), phase shift keying modulation (PSK), pulse width modulation (PWM), quadrature phase shift keying modulation (QPSK), and others. The alternating signal width may be applied to a contact other than the VCC contact. It is not necessary that the alternating signal be applied to a conductive path that also carries another signal; however, doing so may reduce the number of conductive paths, probe pads, and probes required. A contact 94A may provide a VSS signal between die 22A and probe pad 36.

Figure 4A:
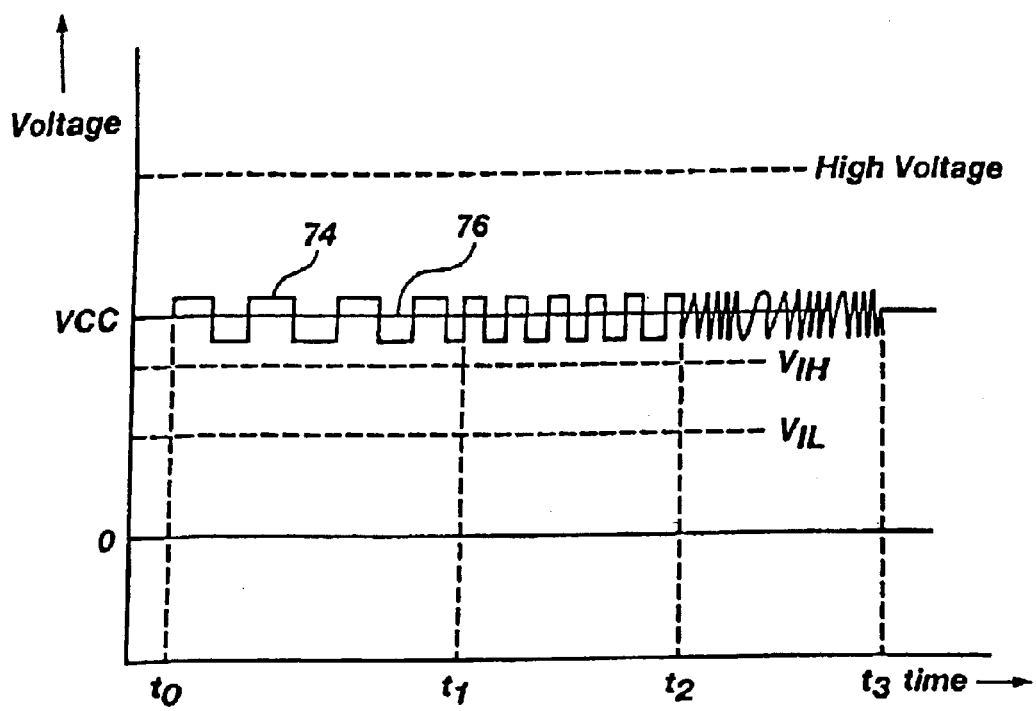
FIG. 4A shows an exemplary graphical representation of alternating signals superimposed on a VCC signal as a function of time.
Figure 4B:
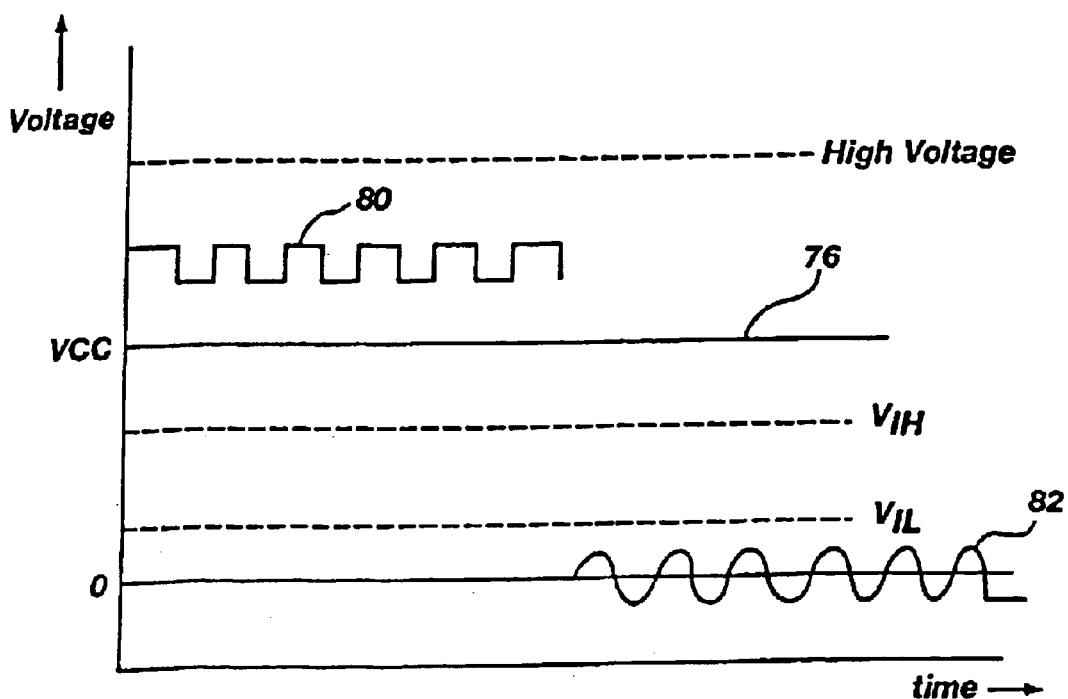
FIG. 4B shows an alternative exemplary graphical representation of alternating signals as a function of time.

Various examples of alternating signals are illustrated in FIGS. 4A and 4B. Referring to FIG. 4A, an alternating signal 74 is superimposed on a VCC signal 76. As used herein "superimposed" means there is a voltage overlap between alternating signal 74 and VCC signal 76. Digital circuitry often includes input buffers (such as input buffer 86 in FIG. 3) that, for example, block signals between voltages $V_{IL}$ and $V_{IH}$. In such a case, it is desirable for the alternating signal to be above or below the range of $V_{IL}$ to $V_{IH}$ so that the alternating signal will be invisible to the buffers. Digital circuitry may also include isolation circuitry (such as low electrostatic discharge (ESD) latching circuit 88 in FIG. 3) that blocks very high voltages, e.g., 13 volts.

To illustrate some possibilities, from time t0 to time t1, alternating signal 74 is a square wave signal having a frequency f1. From time t1 to time t2, alternating signal 74 has a frequency f2, which is greater than f1. In practice, the number of cycles at a particular frequency may be more or less than is shown in FIG. 4A. From time t2 to time t3, alternating signal 74 employs a frequency modulation scheme.

FIG. 4B shows an alternating signal 80 at voltages greater than $V_{III}$ and a sinusoidal alternating signal 82 at voltages less than $V_{II}$. Of course, the present invention is not limited to dice that include circuitry that blocks signals between $V_{III}$ and $V_{II}$.

Types of alternating signals include control alternating signals and data alternating signals. A control alternating signal conveys control information to circuitry. A clock signal may be an example of a control alternating signal. A data alternating signal conveys data to be written into storage or operated upon. For example, a microprocessor may operate on a data that is written into a register by adding it to data written in another register. Some alternating signals include both a control alternating signal and a data alternating signal, because they contain both control and data information.

Referring to FIG. 3, signals passing through input buffer 86 are applied to a VCC power bus 92. VCC power bus 92 carries both the VCC signal and the alternating signal(s). Except for those circuits designed to pass the alternating signals, circuits connected to VCC power bus 92 block the alternating signals.

In operation, demodulator 100 determines one or more characteristics of the alternating signal. Information is conveyed through the alternating signal to die 22A by the characteristics. The alternating signals may have various characteristics including, but not limited to, peak-to-peak amplitudes, average amplitudes, frequency, change in frequency, duration or number of cycles at a particular frequency or voltage, and relationship between average or peak-to-peak voltage and VCC or zero volts or ground. Data may be transmitted through high and low voltages within the peaks of a square wave. It is noted that the alternating signal does not have to be periodic, or if it is periodic, it does not have to be over a large number of cycles. The characteristics of the alternating signal may change with time (e.g., FIG. 4A) to add further information to control die 22A.

A great deal of information may be provided into an alternating signal. For example, upon demodulation, an alternating signal may provide circuitry with control information and clocking information, as well as pass data to be written into memory or operated on.

Clock signals used in die 22A may be generated through at least the following means: (1) the clock signals are generated completely inside die 22A with no control from signals outside die 22A; (2) the clock signals are generated inside die 22A, but under at least some control from the alternating signal supplied from outside die 22A; (3) clock information is encoded in the alternating signal and then extracted from the alternating signal by demodulator 100; or (4) the clock signal is generated completely outside die 22A and supplied to die 22A through the alternating signal or some other signal. Depending on how it is implemented, means (2) may be an example of means (3). Use of the alternating signal in originating or controlling a clock signal (s) can help synchronize dice to each other and external circuitry. Clock signals may be used for timing tests and/or to provide general timing control and information.

As an example of means (2), a clocking device 106 (which may be a local oscillator) may be controlled by a lock signal from demodulator 100 based on clocking information from the alternating signal on conductive path 52 and VCC power bus 92.

By providing an oscillation signal through conductive path 52 and contact 70A, it is not necessary to use a dedicated contact and probe pad for the clock signal. Accordingly, one less probe pad is needed. Of course, another conductive path may be used to provide clock signals or information.

Under some embodiments of the invention, a contact is used to provide data between a die and a probe pad. For example, referring to FIG. 3, a signal may pass from contact 130A of die 22A to probe pad 34, and/or from probe pad 34 through contact 130A to die 22A. Contact 130A may be, but is not required to be, a DQ contact. Contact 130A may be a contact that is used only while die 22A is on wafer 10, or it may continue to be used in ordinary operation of die 22A after it is packaged. Examples of uses for contact 130A include the following. First, a signal from contact 130A may indicate information about the results of tests or other occurrences in die 22A to off-wafer circuitry through probe pad 34. As an example, a fuse or antifuse may be activated upon completion of a test allowing a particular signal to pass through 130A to probe pad 34. The fuse may be blown in response to completion of a test or other event, the occurrence of which may be read then or later. The signal to activate the fuse or antifuse may come from contact 70A or 130A, or some other contact. A signal through contact 130A may be as simple as a single bit (e.g., indicating a test was positive), or more extensive or complicated to provide diagnostic information. The signal from contact 130A may be a stream of data providing, for example, data read from array 114 or some other component in die 22A. There may be more than one contact, such as contact 130A, used to transmit or receive data.

A potential problem in providing output signals to a probe pad from multiple dice is contention on the conductive path to the probe pad. One possible solution is to have a different conductive path for each die output signal.

Figure 5A:
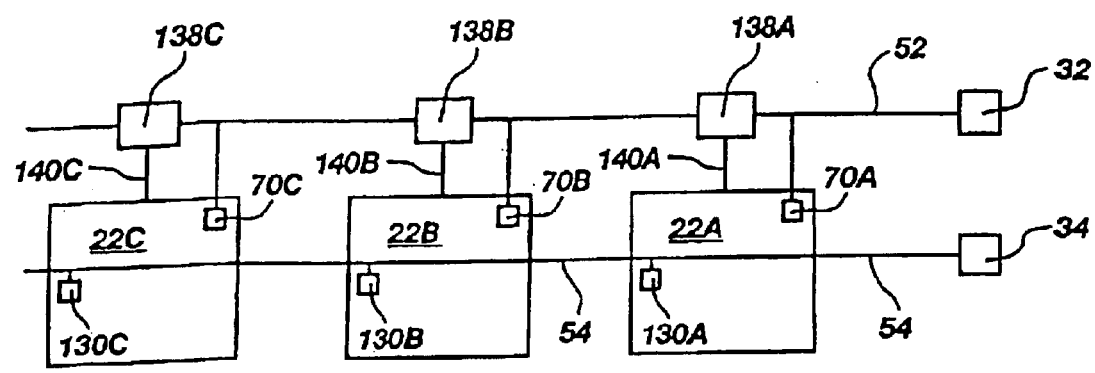
FIG. 5A shows a schematic representation of a system used in connection with blocking instructions in the alternating signal that instruct the dice to send an output signal from the dice to a probe pad.

A second solution is to have only one output conductive path shared by several dice and to design the dice to not provide output signals to the probe pad until being instructed to do so by the alternating signal on conductive path 52. The system controller (which may be off-wafer as described below in connection with FIG. 6) may instruct each die in order (e.g., first die 22A, then die 22B, then die 22C, etc.) to respond to a particular test. If a die had not responded after a certain period of time, the system controller may assume the die was defective in some regard and instruct the next die to respond through its contact 130A. Referring to FIG. 5A, one way in which dice may be instructed in order by the alternating signal is to place buffers 138A, 138B, 138C, etc. on conductive path 52. Just prior to the time at which the dice are to respond, the alternating signal may instruct each die to place its respective buffer in high impedance mode. For example, die 22A may place buffer 138A in high impedance mode by sending a signal through conductor 140A. Die 22B may place buffer 138B in high impedance mode by sending a signal through conductor 140B, etc. Then, upon sending a signal through contact 130A to conductive path 54, die 22A may take buffer 138A out of high impedance mode by sending a signal through conductor 140A. The alternating signal may then instruct die 22B to send a signal through contact 130B to conductive path 54. Buffers 138A–138C may have circuitry to respond to an override by the alternating signal. Such an override may be used if the system controller has not received a signal on conductor 54 after a certain amount of time.

Another way in which the dice may respond in order would be for each die to have its own identification code. A particular die would respond when a code on the alternating signal matched the identification code on the die. The codes may be placed on the dice through a photo process or through the alternating signal.

Figure 5B:
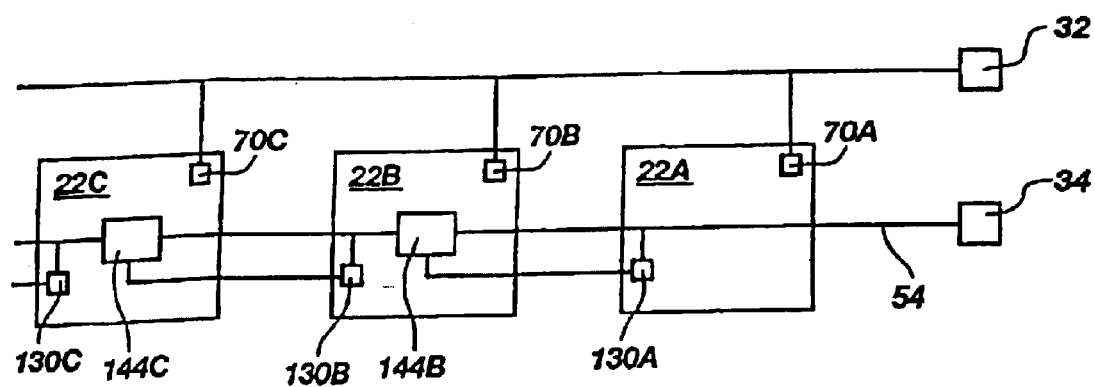
FIG. 5B shows a schematic representation of buffers used in connection with blocking an output signal from the dice to a probe pad.

A third solution is to place buffers along conductive path 54 which are enabled by, for example, a signal on conductive path 54. For example, referring to FIG. 5B, a buffer 144B may be enabled by a signal from contact 130A or some other contact on die 22A, allowing the signal from contact 130B to pass through buffer 144B to probe pad 34. Then the signal from contact 130B (or from some other contact on die 22B) may enable buffer 144C. Depending on the design, a buffer 144A (not shown) between contact 130A and probe pad 34 would not be necessary.

In FIGS. 2 and 3, there are three probe pads connected to each die. There may be a greater or lesser number of probes connected to each die. There are numerous combinations of contacts on the dice to which the probe pads may be connected through conductive paths. The following are some of the possibilities:

| No. of contacts | Contacts on die |
|---|---|
| One contact | 1) VCC (ground may be made through the back of the wafer) |
| Two contacts | 1) VCC |
|  | 2) Gnd |
| Two contacts | 1) VCC (ground may be made through the back of the wafer) |
|  | 2) Signal or test contact |
| Three contacts | 1) VCC |
|  | 2) Gnd |
|  | 3) Signal or test contact |
| Four contacts | 1) VCC |
|  | 2) Gnd |
|  | 3) First signal or test contact |
|  | 4) Second signal or test contact |

Contacts may be any input or output pin including power, address, data, control, n/c (no connects), and ground contacts.

C. System Level Examples

Figure 6A:
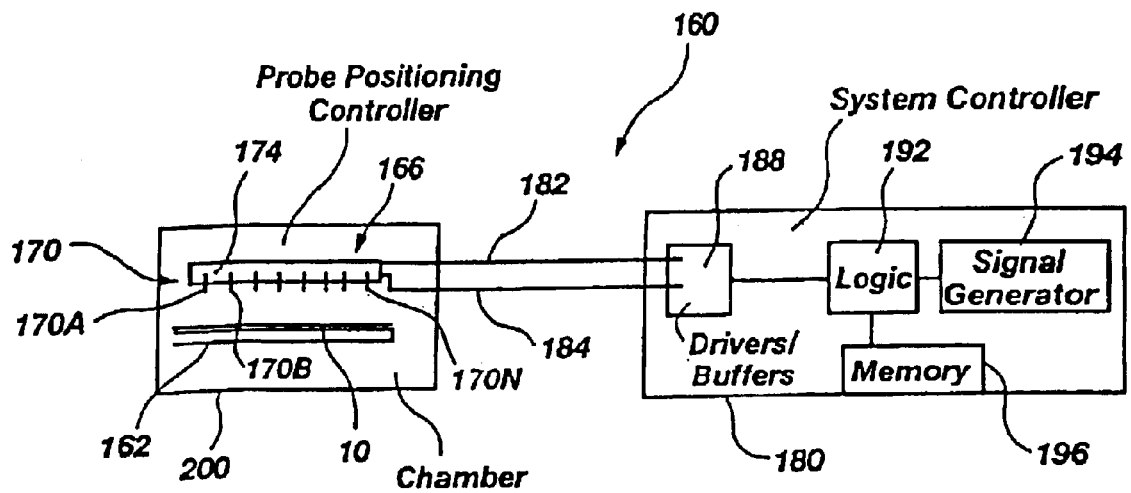
FIG. 6A shows an embodiment of a wafer mode controlling system.

FIG. 6A shows one embodiment of a wafer mode controlling system 160. Wafer 10 is supported by a support 162, which may be part of a vacuum handler. A probe positioning controller 166 includes an array of probes 170 (including probes 170A, 170B, ..., 170N) held by a probe support 174. Probe positioning controller 166 may lower or raise probes 170 as a group. Alternatively, individual ones of probes 170 may be lowered or raised by, for example, solenoids.

A system controller 180 controls probe positioning controller 166 through a conductor(s) 182. System controller 180 also sends signals to and perhaps receives signals from one or more of probes 170 through conductors 184. Logic 192 (which may include one or more microprocessors and dedicated hardware) provides signals to, and may receive signals from, conductors 182 and 184 through drivers/buffers 188. A signal generator 194 may be used to create signals. Alternatively, logic 192 may generate all signals needed. In a preferred embodiment, the alternating signals that are conducted over conductive path 52 originate in system controller 180. Signals may also be generated from circuitry on wafer 10. Memory 196 may be used to store data used by logic 192 and perhaps signal generator 194. System controller 180 may include both digital and analog circuitry.

Wafer 10 may be housed in a heating chamber 200 (such as a burn-in oven), which may be an autoclave. Heat may be generated by heat strips placed on, for example, support 162.

Figure 6B:
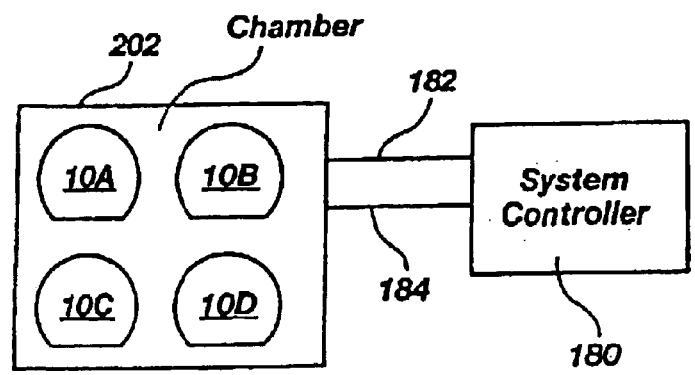
FIG. 6B shows a schematic top view of an embodiment of a wafer mode controlling system in which a chamber contains multiple wafers.

Referring to FIG. 6B, an embodiment of the invention includes heating chamber 202, which accommodates more than one wafer (e.g., wafers 10A, 10B, and 10C, 10D) at a time, which may be simultaneously tested, or otherwise controlled, by system controller 180. (The wafers may be stacked, one above the other.) One or more probe positioning controllers (which may be like controller 166) may be used in heating chamber 202. Whether or not a heating chamber is used, more than one wafer may be simultaneously controlled by system controller 180.

The relatively small number of probes needed to control the wafer reduces the spaced required in heating chambers.

D. Modes

Die 22A may enter, modify, operate within, or exit certain modes based on the characteristics of the alternating signal obtained through demodulator 100 and associated circuitry. Data may be transmitted through the alternating signal in a mode. The following are examples of the various modes within which die 22A may enter, modify, operate within, or exit in response to reception of information from the alternating signal:

1. Testing Modes

Referring back to FIG. 3, in various testing modes, die 22A may perform self-tests to determine whether certain portions of die 22A perform according to specification. These tests may include functional and/or parametric tests. Merely as an example, test circuit 110 may write data to locations in an array 114 and then read from the locations in array 114 to determine if the data properly stored. Errors may be identified through error block 118 and logic block 122. Other components of die 22A (such as periphery 128) may be tested.

Test patterns and addressing information may be provided on the alternating signal on, for example, conductive path 52. For example, a first portion of the alternating signal may specify a particular test to be performed. A second portion of the alternating signal may provide the data to be written and the addressing information. A third portion of the alternating signal may indicate the conclusion of the test mode, or initiate another event such as a self-repair mode. Alternatively, test patterns and other information can be stored in memory on die 22A, or in a chip on wafer 10.

As discussed above, data may be passed from contact 130A through conductive path 54 to probe pad 32. Such data may indicate that a test was successful or a test was not successful, or other diagnostic information.

2. Stressing Modes

As noted above, certain defects in a die will only appear after the die has been operated over a period of time under various conditions. These conditions may be accelerated in a self-stressing mode. An alternating signal with certain characteristics may initiate and control self-stressing.

3. Repair Modes

In various self-repair modes, die 22A may repair various components through, for example, activating redundant circuits. The self-repair modes, including back-end repair, may be activated by different alternating signals. An alternating signal on conductive path 52 may indicate which fuse or antifuse should be activated. Because complicated tests may be done while the die is on the wafer, repairs may be done before stressing including burn-in, prior to the completion of stressing, or after stressing.

Time and resources are saved if a repair is made before burn-in or other stressing. Time and resources are also saved if it is determined before burn-in or other stressing that a repair is not available.

E. Additional Examples, Explanations, and Variations

Figure 7:
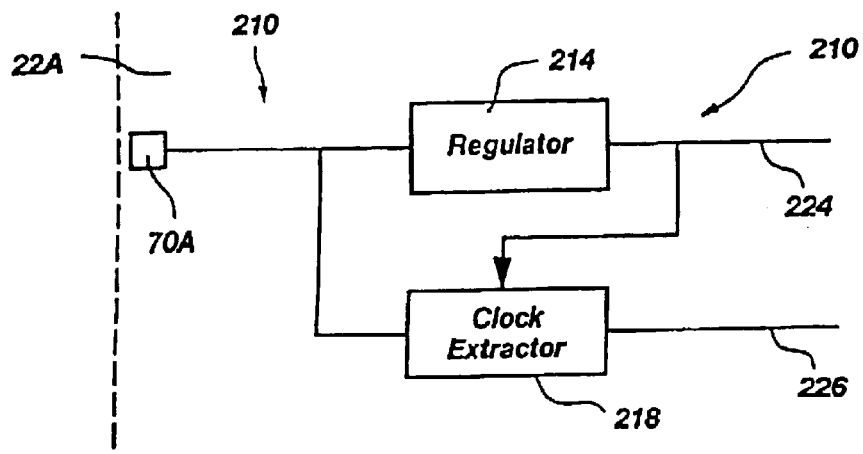
FIG. 7 shows a first alternative input circuit that may be used in a die as part of the present invention.
Figure 8A:
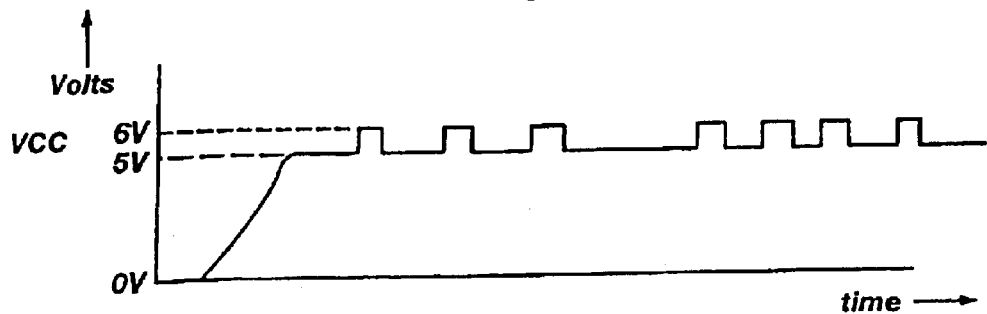
FIG. 8A shows a signal received at the input contact of the circuit of FIG. 7.
Figure 8B:
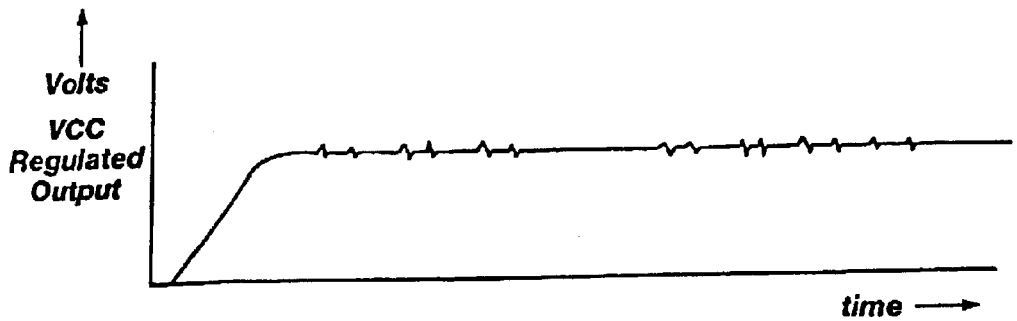
FIG. 8B shows a signal supplied at an output of a regulator in FIG. 7.
Figure 8C:
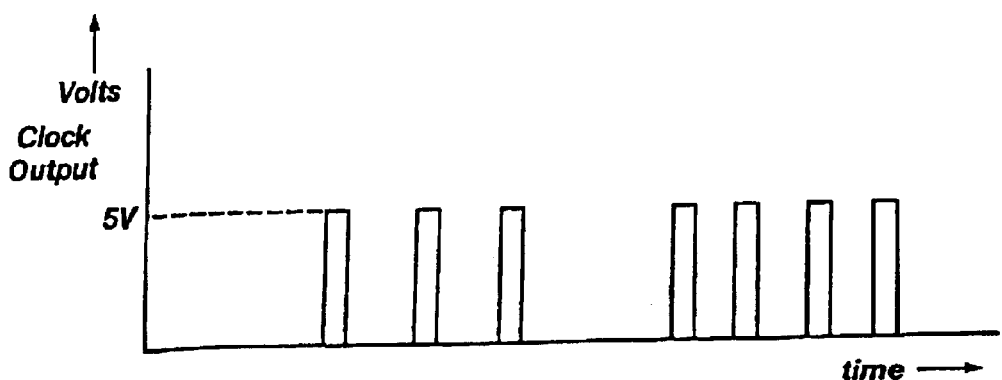
FIG. 8C shows a signal supplied at an output clock extractor in FIG. 7.

Various input circuits may be used in die 22A. Referring to FIG. 7, a first alternative input circuit 210 for die 22A includes a regulator 214 and a clock extractor 218. FIG. 8A shows an alternating signal (or a portion of one) received at contact 70A. FIG. 8B shows the regulator output at a conductor 224. FIG. 8C shows a clock output at a conductor 226.

Figure 9:
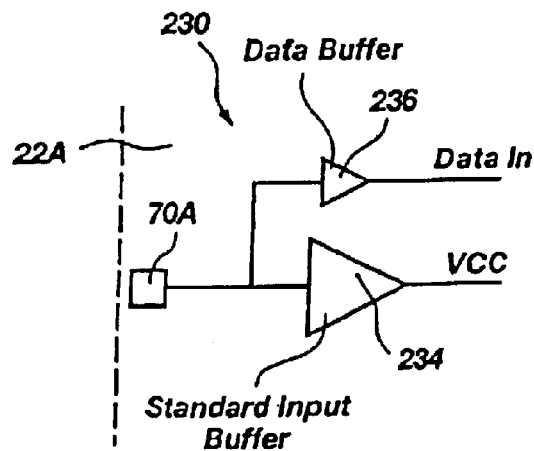
FIG. 9 shows a second alternative input circuit that may be used in a die as part of the present invention.
Figure 10A:
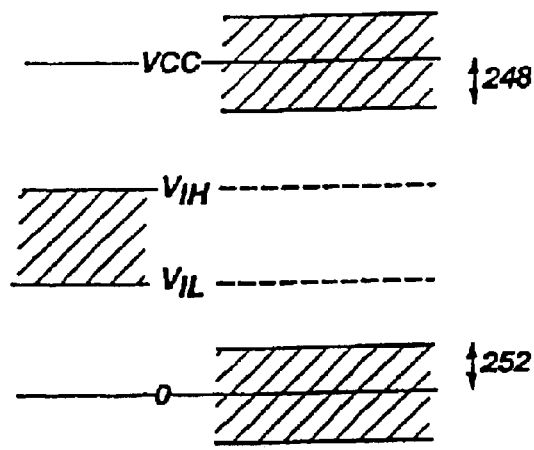
FIG. 10A shows a graphical representation of certain signals included in the alternating signal received by the circuit of FIG. 9.
Figure 10B:
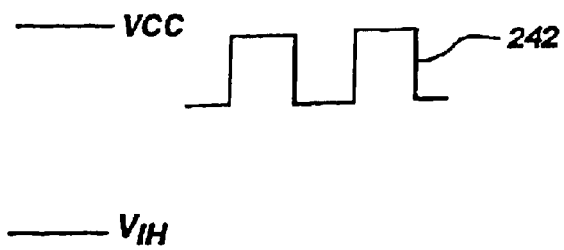
FIG. 10B shows signal levels above and below a $V_{III}$ and $V_{II}$ range.

Referring to FIG. 9, a second alternative input circuit 230 for die 22A includes a standard input buffer 234 in parallel with a data buffer 236. The alternating signal is received on a contact 70A (which may act as a row address strobe signal (RAS) contact pad). As an example, referring to FIG. 10A, the alternating signal includes signals in the low level range 248 or alternative low level range 252 at, for example, low or radio frequencies. The data input levels are invisible to standard input buffer 234 if above $V_{IH}$ or below $V_{IL}$. Referring to FIG. 10B, an input signal 242 at contact 70A in unmodulated form within range 248 is received at contact 238 (not shown). Input buffer 234 passes VCC (or the RAS signal), and data buffer 236 passes the data-in signal.

Figure 11:
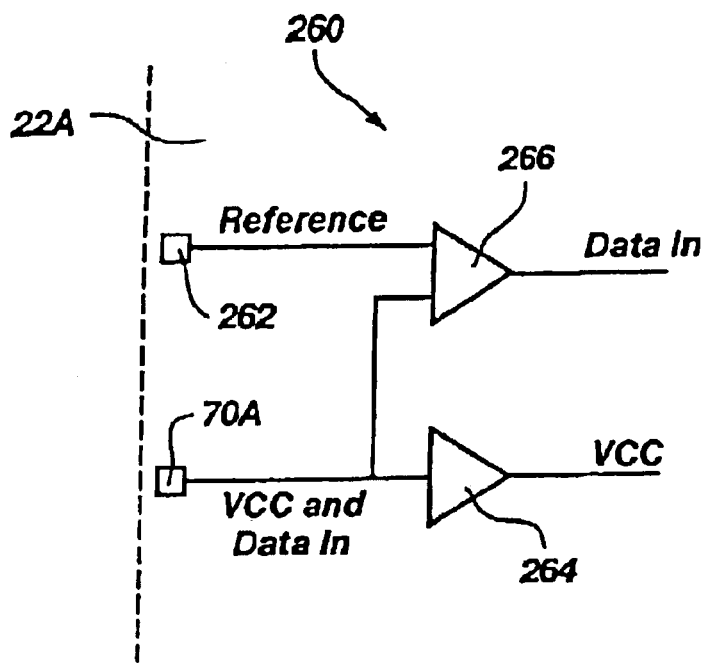
FIG. 11 shows a third alternative input circuit in which a second contact carries a reference signal.
Figure 12:
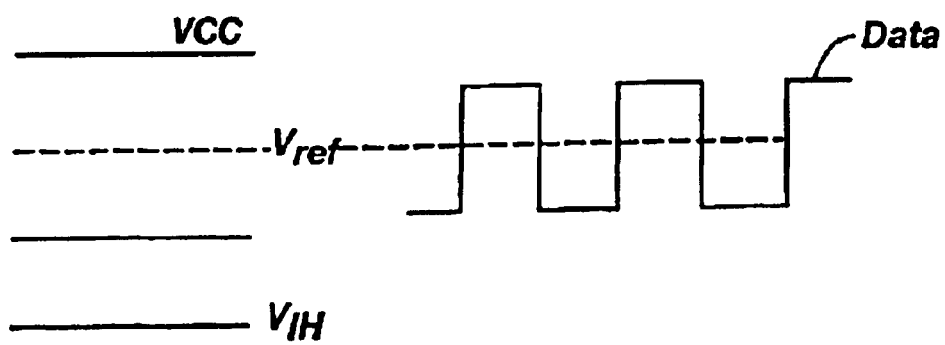
FIG. 12 is a graphical representation of the input and reference signal received by the circuit of FIG. 11.

Referring to FIG. 11, a third alternative input circuit 260 is similar to circuit 230 of FIG. 10, except that circuit 260 includes a second contact 262 that receives a reference level signal (shown in FIG. 12). A standard buffer 264 passes VCC and a buffer 266 passes the data-in signal from the alternating signal. Using contact 262 to pass a reference signal allows more information to be held off chip, but at a cost of an extra probe pad and conductive path.

Figure 13:
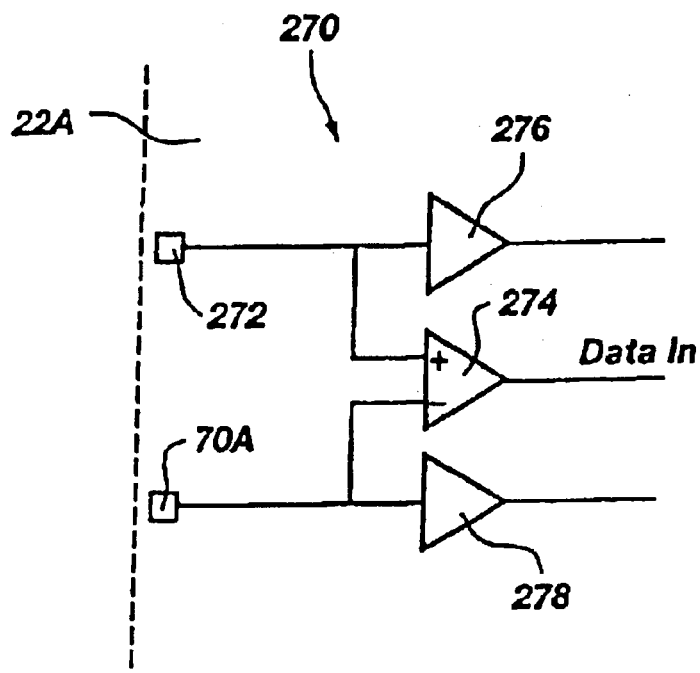
FIG. 13 shows a fourth alternative input circuit including a differential circuit.
Figure 14:
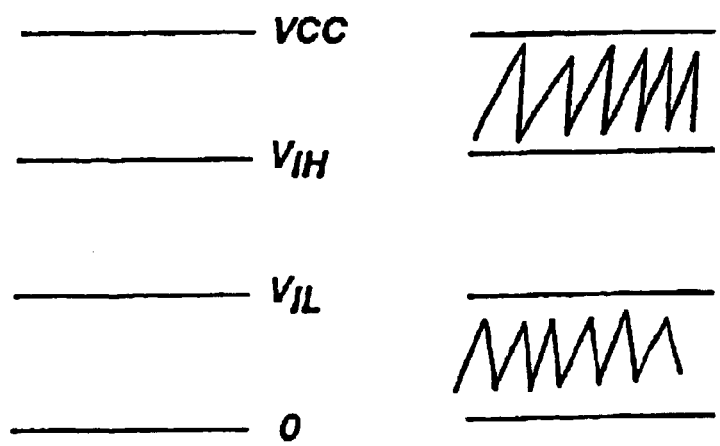
FIG. 14 shows an example of ranges or input signals that may be supplied to the circuit of FIG. 13.

Referring to FIG. 13, a fourth alternative input circuit 270 in which the data from contact 70A and data from contact 272 is fed into a differential buffer 274 such that a reference voltage is not needed. Buffers 276 and 278 produce individual control and/or data streams, as does differential buffer 274 through summing the signals at contacts 70A and 272. Referring to FIG. 14, the input signal to contacts 70A and 272 may be modulated with amplitude modulation (AM), frequency modulation (FM), pulse modulation (PM), or any other acceptable format at, for example, low frequency or radio frequency.

Figure 15:
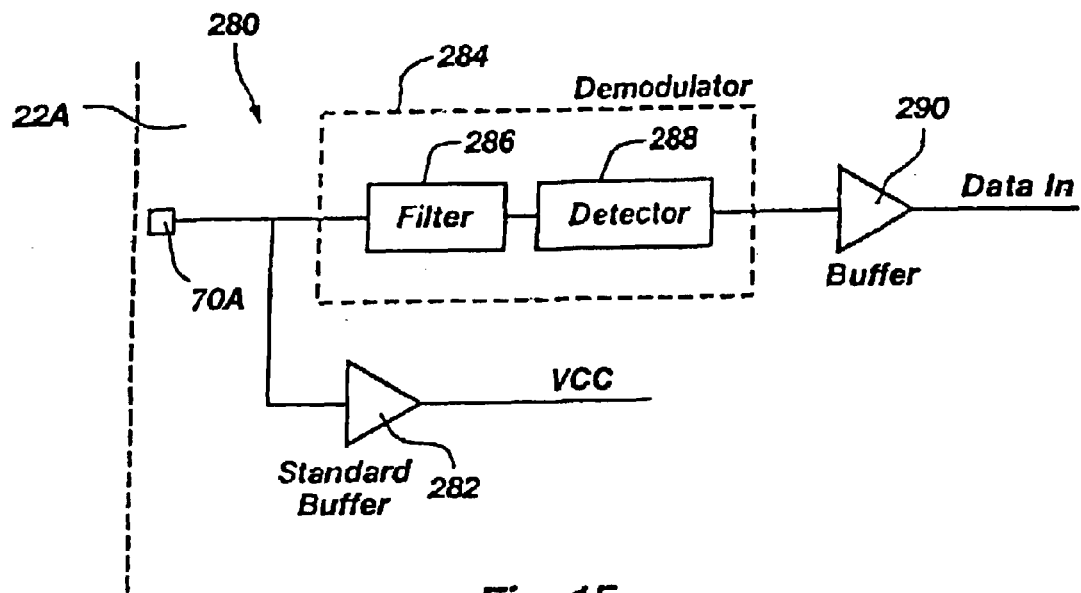
FIG. 15 shows a fifth alternative input circuit including a detector.

Referring to FIG. 15, a fifth alternative input circuit 280 receives the VCC and data-in signals at contact 70A. A standard buffer 282 passes VCC. A demodulator 284 includes a filter 286 and a detector 288 that extract the data-in signal, which is passed through buffer 290. Detector 288 may be, for example, an FM/PM discriminator or an AM detector. The detector design will vary with the method of modulation selected.

Figure 16:
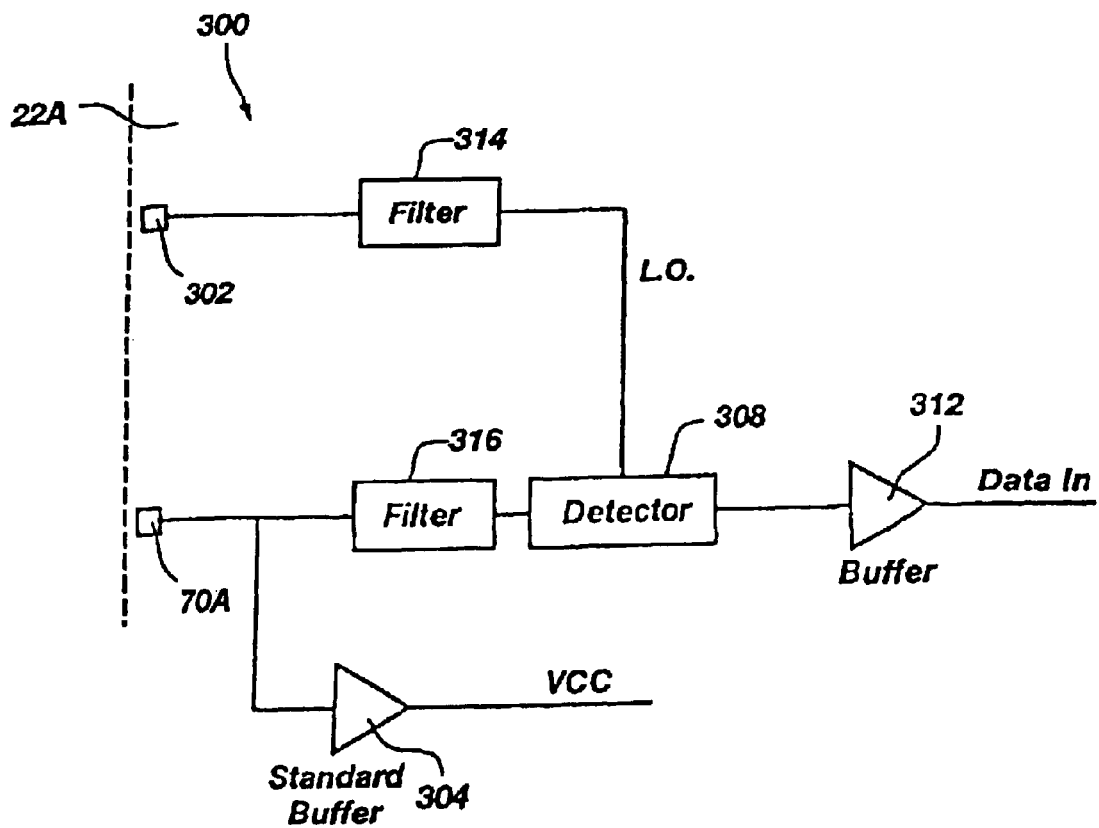
FIG. 16 shows a sixth alternative input circuit that may receive a local oscillator reference signal.

Referring to FIG. 16, a sixth alternative input circuit 300 receives the VCC and data-in signal from contact 70A and a reference local oscillator signal on a contact 302. The VCC signal is passed by standard buffer 304. A detector 308 provides the data-in signal to buffer 312 based on signals from filters 314 and 316. Again, supply of the reference signal from off chip makes the detector design easier. However, a carrier frequency local oscillator may be on or off the die.

Note that there is not necessarily any significance in providing different reference numerals for contacts 262, 272, and 302. For simplicity, the input circuits of FIGS. 7, 9, 11, 13, 15, and 16 do not necessarily include all well known circuitry.

There are various data formats of the alternating signal. An exemplary format may include a header, data packet, addressing, or a parity bit. Supplying an external clock via an additional contact tends to greatly simplify the circuit design.

The present invention may be used in connection with supervoltage test means and miscellaneous programming.

It is expected that the greatest utility for the present invention will be for dice at the wafer stage. In most cases, it is expected that the alternating signal will not be applied to a die after it is packaged and used in ordinary operation. However, the alternating signal may be applied and the die placed in modes or data communicated to the die after the die has been packaged and used in ordinary operation. Alternatively, the circuitry that responds to the alternating signals may be disabled prior to shipping the die for commercial use.

Figure 17:
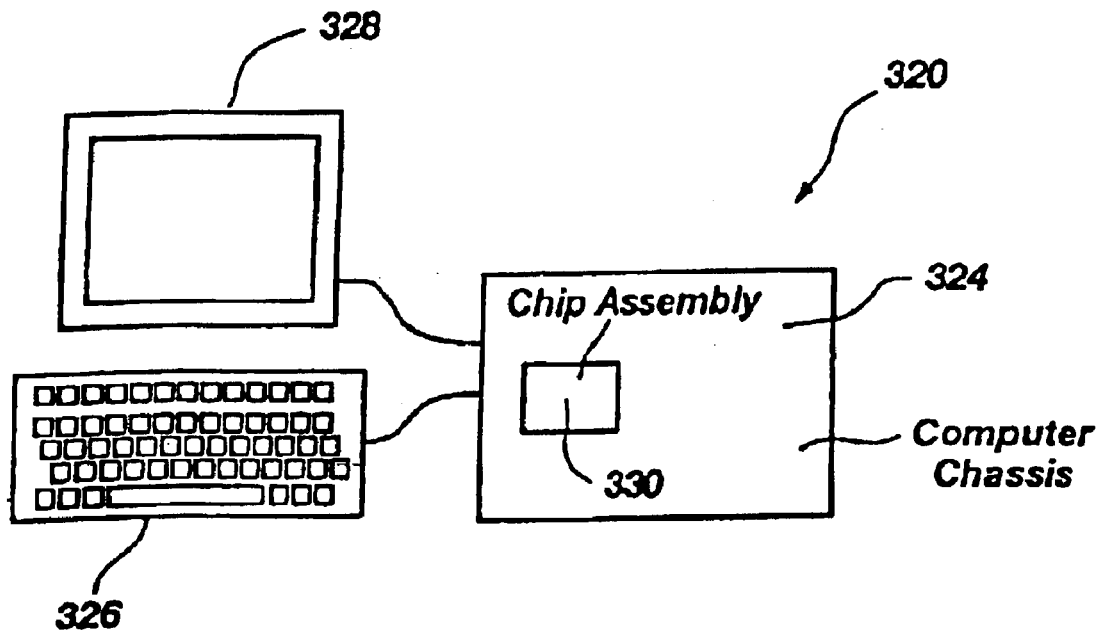
FIG. 17 shows a schematic representation of a chip assembly under the present invention as part of a computer system.

In any event, a chip assembly having a die constructed according to the present invention may be used in a computer system or other system. For example, FIG. 17 illustrates a computer system 320 that includes a computer chassis 324, a keyboard 326, and a display monitor 328. Computer chassis 324 includes various electronic components including at least one chip assembly 330. Chip assembly 330 includes a die constructed according to the present invention (i.e., a chip assembly that includes a die having circuitry designed to receive an alternating signal). Once packaged, or otherwise prepared for commercial use, die 22A would be part of such a chip assembly.

Figure 18:
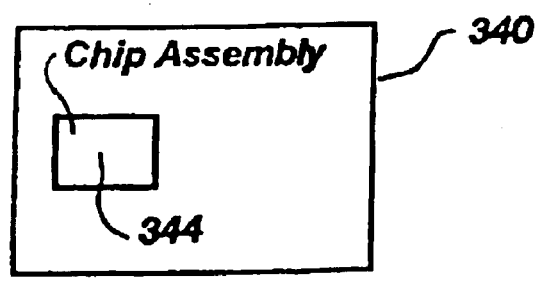
FIG. 18 shows a schematic representation of a chip assembly under the present invention of an electronic device.

FIG. 18 illustrates an electronic device 340 that includes various electronic components including a chip assembly 344 (which may be the same as chip assembly 330). Chip assembly 344 includes a die constructed according to the present invention. Electronic device 340 may be any electronic device that includes dice, including, without limitation, memory devices, printers, displays, keyboards, computers (such as computer system 320), oscilloscopes, medical diagnostic equipment, and automobile control systems, to name only a few.

Substrate 14 may be formed of a variety of materials including silicon and gallium-arsenide. Wafer 10 is not limited to any particular shape or size, although currently 6" and 8" diameter wafers are popular. The dice are not limited to any particular type of dice. For example, the dice may be formed of various materials including silicon and gallium-arsenide. The dice may be such as are used with any of various memory chips, microprocessors, or application specific integrated circuits (ASICs).

Factors to consider in determining the number of probe pads include limits to the amount of current passing through a single pad, expense, space available for probe pads, and avoiding complexity.

As used in the claims, the terms "connect," "connectable," or "connected" are not necessarily limited to a direct connection. For example, probe pad 32 is connected to die 22A, although indirectly through conductive path 52. Further, there may be intermediated electronic components along or in the conductive paths, for example, buffers or amplifiers. In such a case, probe pad 32 would still be connected to die 22A, although indirectly. However, as used herein, the word "connected" refers to an operational connection and not a mere indirect connection. For example, every portion of the wafer is directly or indirectly connected with every other portion, but not every portion is operationally connected to another portion.

The materials mentioned herein, such as probe pads, contacts, conductive paths, and portions of the die and system, may be constructed according to various well known techniques from various well known materials.

There may be various standard, well known circuits on the wafer 10, other than the dice. Also, there may be additional buffers or amplifiers on wafer 10 separate from the dice. Further, there may be reductant probe pads, conductive paths, and contacts under the design of the present invention.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor wafer having a substrate as a portion thereof comprising:

a plurality of dice located on portions of said substrate, said plurality of dice including circuitry for placing at least one die of said plurality of dice into a mode upon receipt of an alternating signal having a predetermined characteristic by said circuitry, said mode selected from one of a predetermined testing mode for testing a plurality of dice, a functional test mode, and a parametric test mode, said alternating signal selected from one of a test pattern signal and information in a signal form; and a conductive path connected to said circuitry providing said alternating signal to said circuitry.

2. The wafer of claim 1, wherein said alternating signal further comprises a plurality of test patterns for said plurality of dice.

3. The wafer of claim 1, wherein said alternating signal further comprises a plurality of information for said plurality of dice.

* * * * *

UNITED STATES PATENT AND TRADEMARK OFFICE
CERTIFICATE OF CORRECTION

PATENT NO. : 6,852,999 B2  Page 1 of 1
APPLICATION NO. : 10/391067
DATED : February 8, 2005
INVENTOR(S) : Warren M. Farnworth et al.

It is certified that error appears in the above-identified patent and that said Letters Patent is hereby corrected as shown below:

In the specification:

COLUMN 11, LINE 26, change "healing chamber 202" to --heating chamber 202--
COLUMN 11, LINE 53, after "data" and before "properly" insert --was--

Signed and Sealed this

Sixteenth Day of October, 2007

JON W. DUDAS
*Director of the United States Patent and Trademark Office*